United States Patent [19]
Wu

[11] Patent Number: 5,919,062
[45] Date of Patent: Jul. 6, 1999

[54] ELECTRICAL CONNECTOR WITH AN IMPROVED SHELL MEANS

[75] Inventor: Kun-Tsan Wu, Tu-Chen, Taiwan

[73] Assignee: Hon Hai Precision Ind. Co., Ltd., Taipei Hsien, Turkey

[21] Appl. No.: 08/939,276

[22] Filed: Sep. 29, 1997

[30] Foreign Application Priority Data

Nov. 27, 1996 [TW] Taiwan ................................ 85218412

[51] Int. Cl.⁶ ................................................ H01R 13/648
[52] U.S. Cl. .............................................. 439/607; 439/83
[58] Field of Search ............................ 439/83, 607, 609, 439/79, 92, 95

[56] References Cited

U.S. PATENT DOCUMENTS

| | | | |
|---|---|---|---|
| 5,281,169 | 1/1994 | Kiat et al. | 439/607 |
| 5,591,050 | 1/1997 | Sueoka | 439/607 |
| 5,676,569 | 10/1997 | Davis | 439/540.1 |
| 5,759,067 | 6/1998 | Scheer | 439/607 |

*Primary Examiner*—Khiem Nguyen

[57] ABSTRACT

An electrical connector for electrically connecting an exterior mating connector to a circuit board, mainly comprises an insulative housing, a shell means and a plurality of contacts. The insulative housing includes a plurality of walls wherein the top wall and the opposing lateral walls thereof each form a first retention. The shell means includes a plurality of surfaces wherein the top surface and the opposing lateral surfaces each form a second retention for being retained with said first retentions of the housing. Accordingly, the retentive effect between the shell means and the housing is enhanced. Additionally, the shell means further includes a pair of grounding portions each consisting of a connecting section, an engaging section and a protrusion for providing a grounding function wherein the protrusion enlarges a solder contact area with a soldering paste pre-coated on a surface of the circuit board for further enhancing the retention between the shell means and the circuit board.

10 Claims, 6 Drawing Sheets

5,919,062

ELECTRICAL CONNECTOR WITH AN IMPROVED SHELL MEANS

BACKGROUND OF THE INVENTION

1. Field of the Invention

The present invention relates to an electrical connector for electrically connecting an exterior mating connector to a circuit board, and particularly to an electrical connector having an improved shell means for enhancing the retentive effect with both an insulative housing of the connector and the circuit board.

2. The Prior Art

Due to the trend of current market demand, some electrical connectors, like the mini type connector, are generally dimensioned to be increasingly smaller and more delicate. However, as the miniaturization of connector design progresses, some retentive structures provided by electrical connectors with regard to a shell of the housing are compromised diminishing the retentive effect therebetween. In addition, such a shell lacks a retentive structure to ensure direct and continuous retainment on the circuit board. Therefore, the shell of the connector may become loose after repeated engagements and disengagements with an exterior mating connector. Such electrical connectors can refer to the disclosures of U.S. Pat. Nos. 4,842,554 and 5,186,633.

Other electrical connectors are proposed that adopt surface mounting technology (SMT) to retain the shell of the connector onto a surface of the circuit board whereby the connector can engage the shell to be retentively mounted on said surface of the circuit board to enhance the retentive effect as mentioned above. If corresponding grounding circuits exist on said surface of the circuit board, the mounted shell can further provide the connector with grounding capability. However, such SMT type electrical connectors do not effectively resolve the retention problems between the circuit board and the shell. For example, as shown in FIG. 1, a grounding pad (70) integrally formed on a shell of an electrical connector (not shown) for being grounded to a circuit board (50) is shaped into a vertically bent plate with respect to the shell. The grounding pad (70) is horizontally located above a liquid layer which is consists of a soldering paste (90) and is pre-coated on a surface of the circuit board (50) for aiding the grounding pad (70) being soldered onto the circuit board (50). Due to the liquidity of the soldering paste (90), the limited contact area between the grounding pad (70) and the soldering paste (90) will not maintain adequate retention between the grounding pad (70) and the circuit board (50). Therefore, such a shell may become separated from the circuit board. Such a SMT type electrical connectors can refer to the disclosure of Taiwan Application No. 82,111,200.

Accordingly, to resolve the above disadvantages, an object of the present invention is to provide an electrical connector which includes an improved shell means to enhance the retention between the shell means and an insulative housing of the connector.

Another object of the present invention is to provide an electrical connector which includes an improved shell means with a grounding portion to enhance the retentive effect between the shell means and the circuit board and to provide a grounding capability.

SUMMARY OF THE INVENTION

According to an aspect of the present invention, an electrical connector for electrically connecting an exterior mating connector to a circuit board, mainly comprises an insulative housing, a shell means and a plurality of contacts. The insulative housing includes a plurality of walls wherein a top wall and each opposed lateral wall thereof each forms a first retention, and a front wall thereof defines a mating slot which has an engaging plate therein for receiving the contacts. The shell means includes a plurality of surfaces wherein a top surface and each opposed lateral surface thereof each forms a second retention thereon for retentive cooperation with said first retentions of the housing, and a continuous extension rearwardly extends from a border of an opening defined on a front surface thereof and is received within said mating slot of the housing. Therefore, by means of cooperation between the first retentions and the second retentions, the retentive effect between the shell means and the housing is enhanced. The shell means further includes a pair of grounding portions each consisting of a connecting section, an engaging section and a protrusion for providing a grounding function wherein the protrusion enlarges a solder contact engaging with a soldering paste pre-coated on a surface of the circuit board, for enhancing the retention between the shell means and the circuit board.

DETAILED DESCRIPTION OF THE PREFERRED EMBODIMENTS

Figure 2:
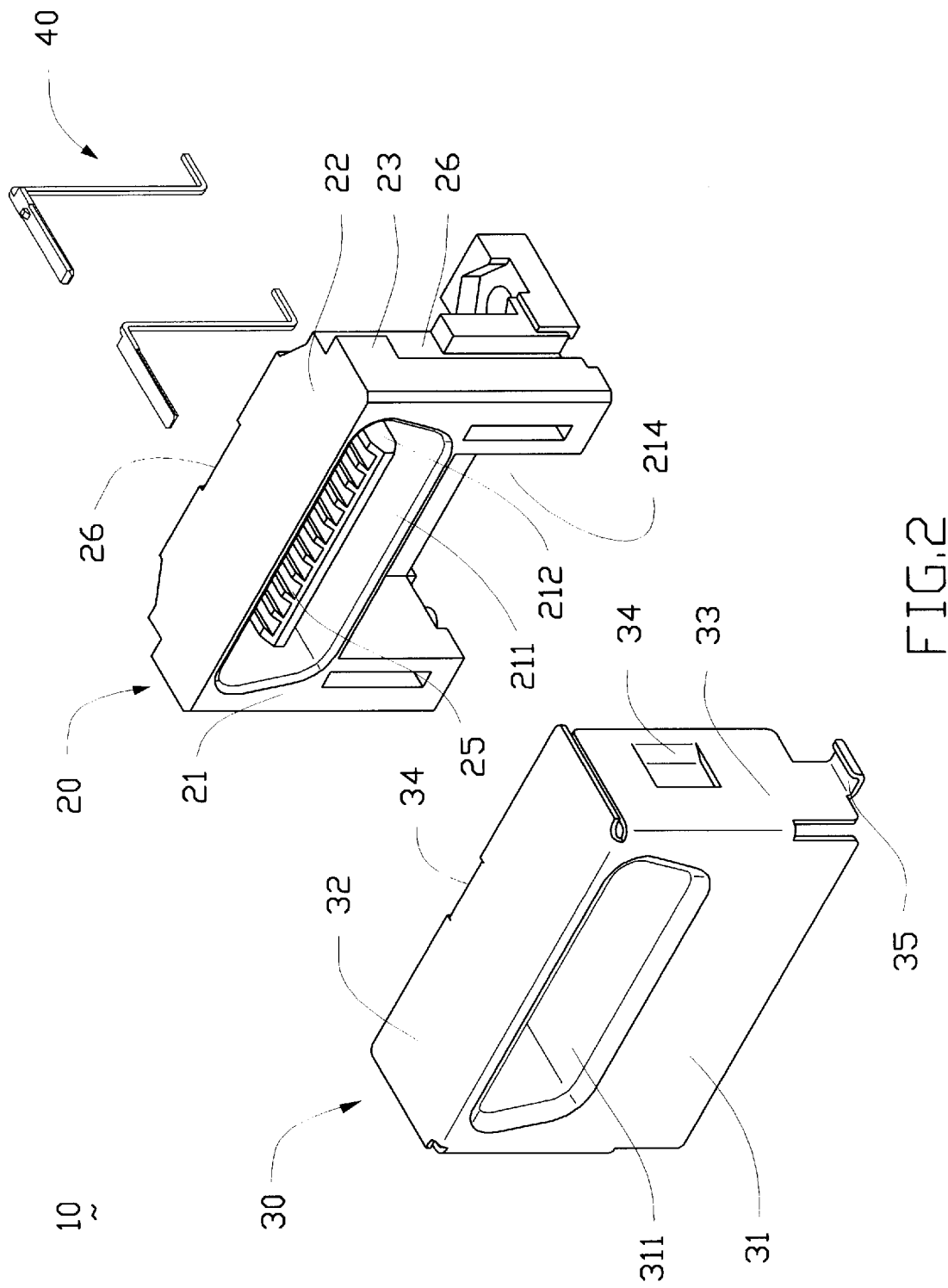
FIG. 2 is an exploded perspective frontal view of an electrical connector according to the present invention.
Figure 3:
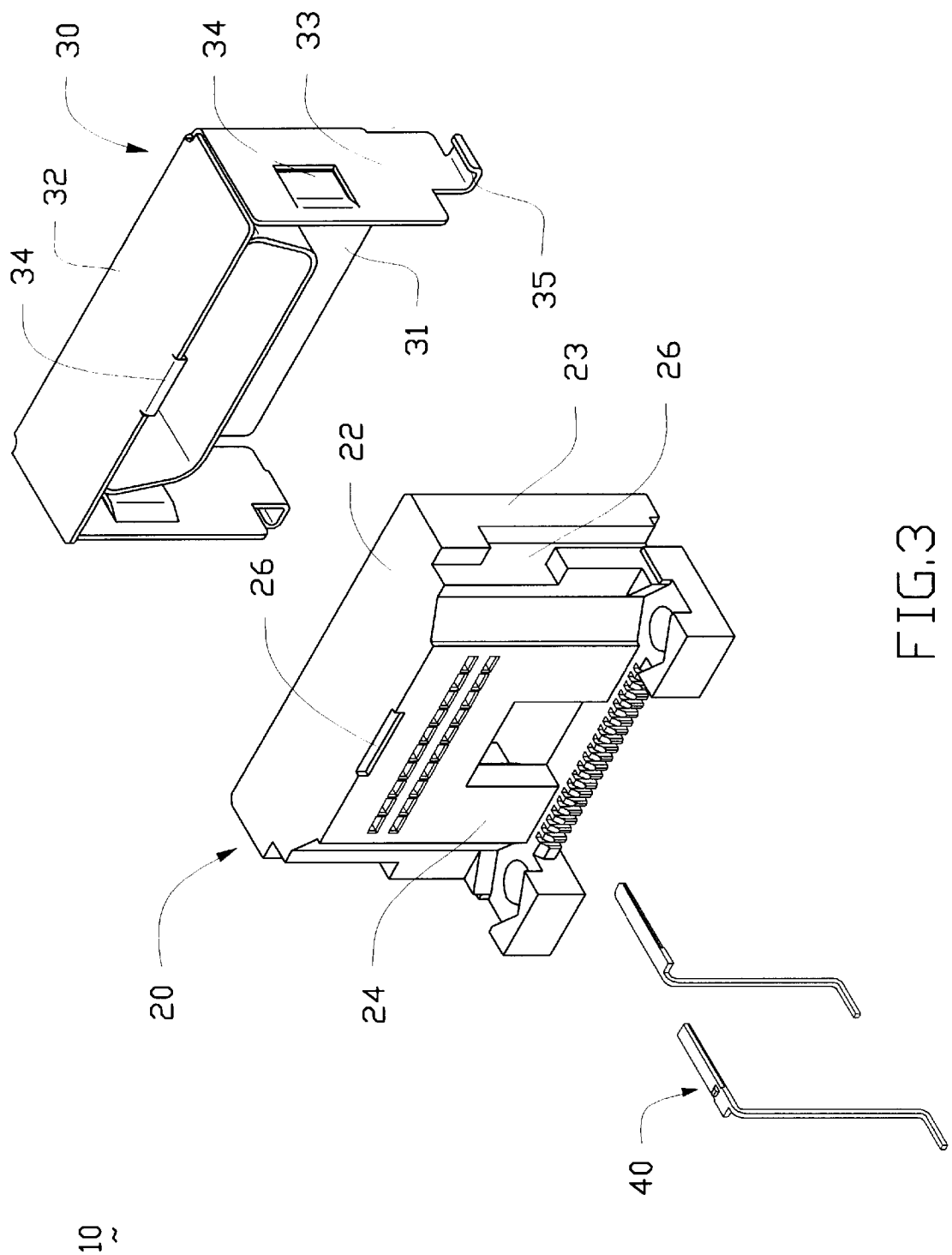
FIG. 3 is an exploded perspective rear view of the electrical connector according to the present invention.

References will now be made in detail with regard to the preferred embodiment of the present invention. As shown in FIGS. 2 & 3, an electrical connector (10) for electrically connecting an exterior mating connector (not shown) to a circuit board (50) (shown in FIG. 6), mainly includes an insulative housing (20), a shell means (30), and a plurality of contacts (40).

Figure 4:
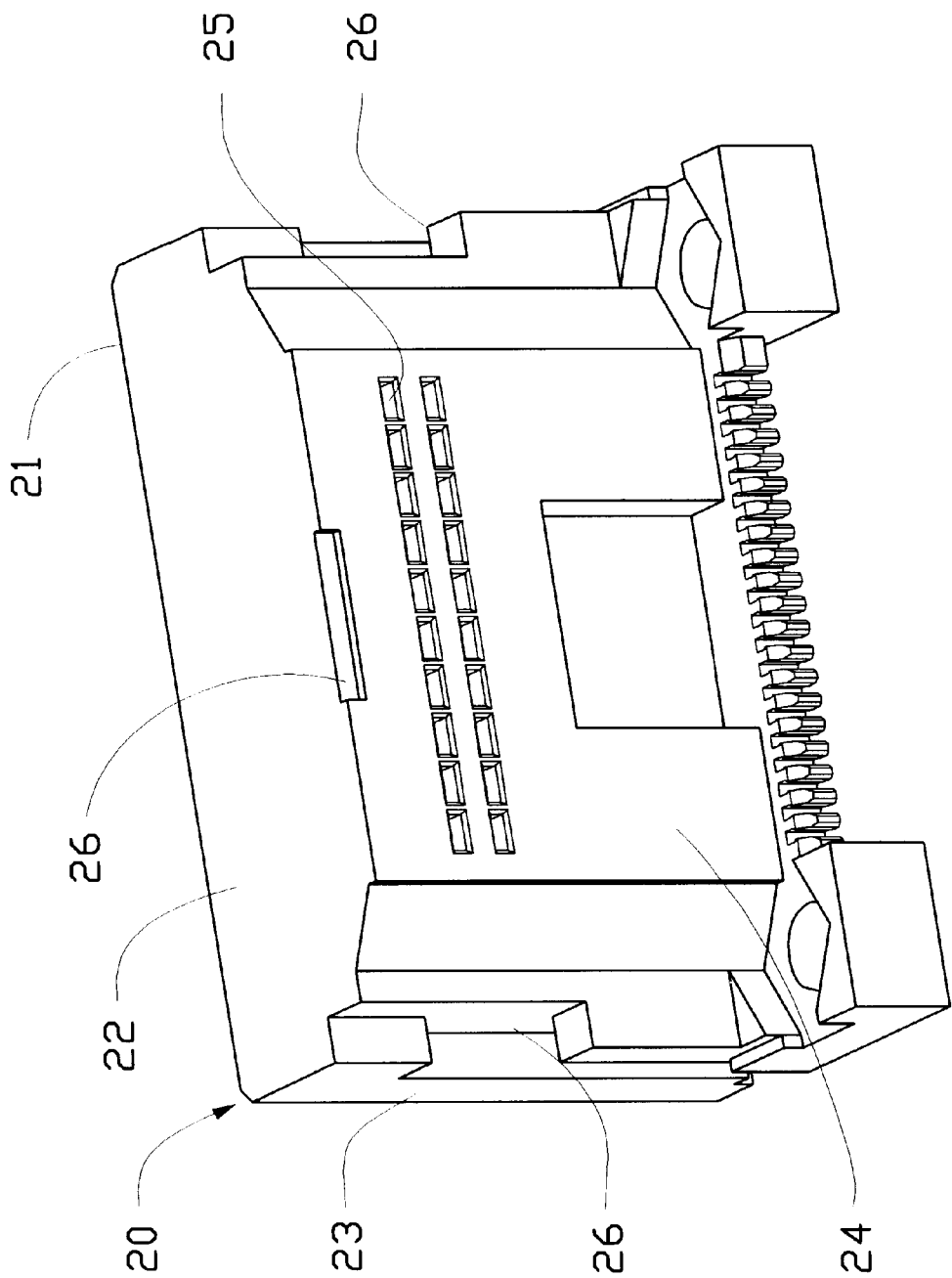
FIG. 4 is a perspective rear view of an insulative housing of the electrical connector according to the present invention.

Furthermore, as shown in FIGS. 2–4, the insulative housing (20) includes a front wall (21), a top wall (22), two opposite lateral walls (23) and a rear wall (24) wherein the front wall (21) defines a mating slot (211) for receiving the exterior mating connector (not shown). An engaging plate (212) is integrally formed on the rear wall (24) and outwardly extends from the mating slot (211) and defines a plurality of passageways (25) for receiving the contacts (40). A cavity (214) is separated form and formed under said mating slot (211), for receiving an electrical component (not shown) like a filter chip. In addition, a plurality of first retentions (26) are each defined as a notch on the top wall

(22) and the opposing lateral walls (23) for retentive cooperation with the shell means (30).

Figure 5:
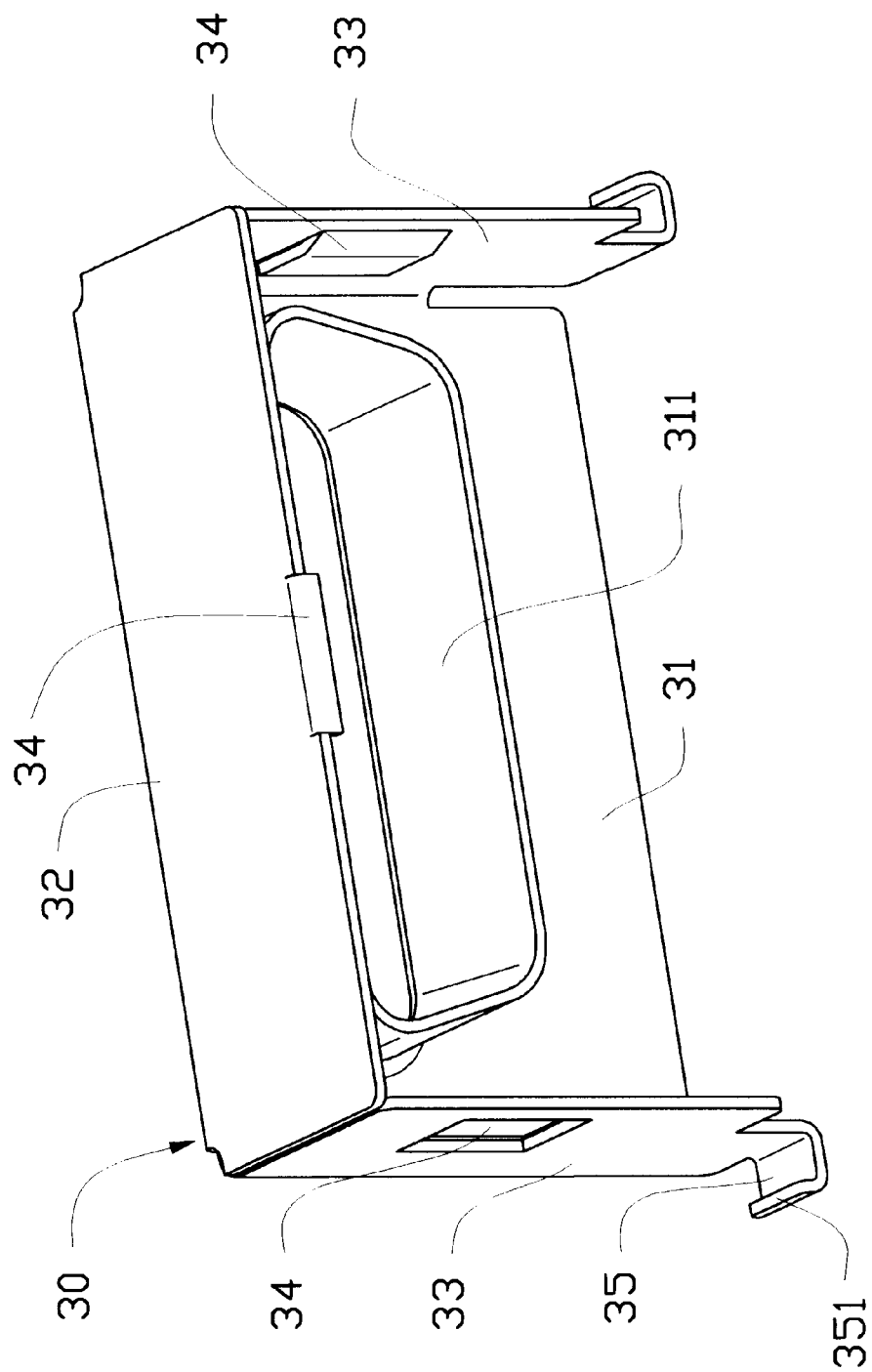
FIG. 5 is a perspective rear view of a shell means of the electrical connector according to the present invention.

The shell means (30) as shown in FIGS. 2, 3 & 5, includes a front surface (31), a top surface (32) and two opposed lateral surfaces (33) wherein a continuous extension (311) is rearwardly extruded from the front surface (31) to surround a border of an opening (not labeled) formed on the front surface (31) and to be received within the mating slot (211) of the housing (20). The continuous extension (311) surrounds the inside of the mating slot (211) to establish a grounding connection with a shell of the exterior mating connector (not shown). The front surface (31) of the shell means (30) can further cover the cavity (214) of the housing (20) for shielding protection to the electrical component received within the cavity (214).

Figure 7:
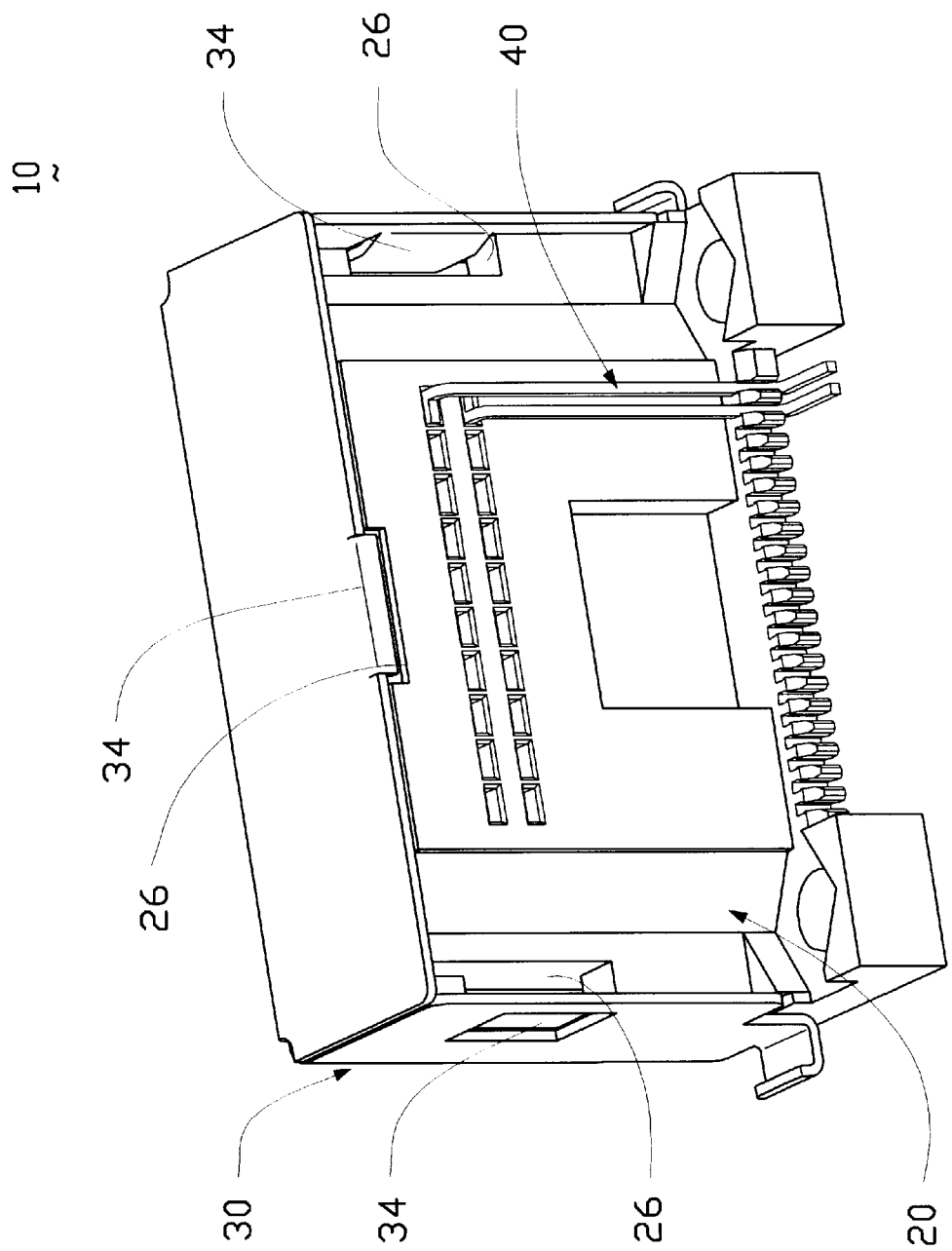
FIG. 7 is a perspective rear view of the electrical connector of FIG. 3.

In addition, a plurality of second retentions (34) are each formed as a barb on the top surface (32) and the opposing lateral surfaces (33) of the shell means (30) for retentive cooperation with the insulative housing (20). Referring to FIGS. 4 & 5, when the top surface (32) and the opposing lateral surface (33) of the shell means (30) respectively cover the top wall (22) and the opposing lateral walls (23) of the housing (20) to shield the housing (20), each second retention (34) of each surface (32, 33) of the shell means (30) is restricted within the first retention (26) in each wall (22, 23) of the housing (20). Therefore, the shell means (30) is effectively retained on the housing (20) as shown in FIG. 7.

Figure 6:
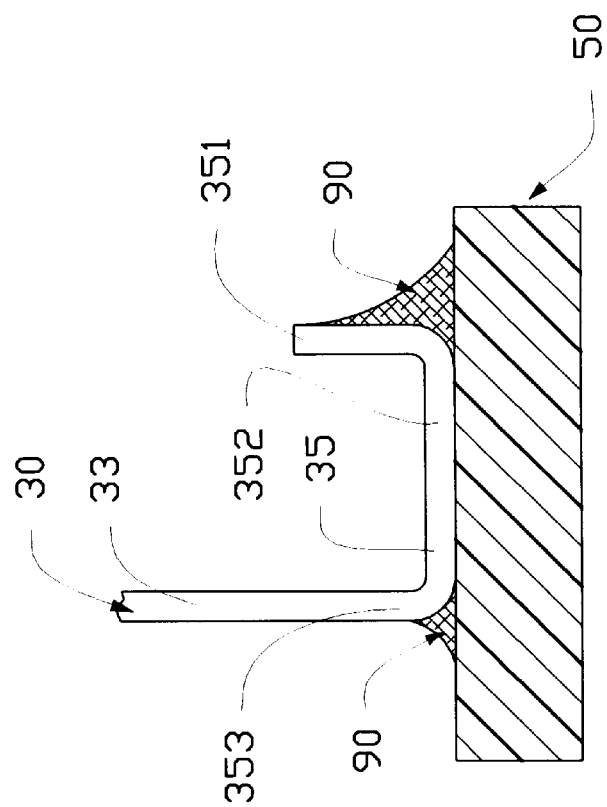
FIG. 6 is a partial cross-sectional view of the electrical connector according to the present invention showing a grounding portion soldered on a circuit board establishing an enlarged solder contact area with the soldering paste.
Figure 1:
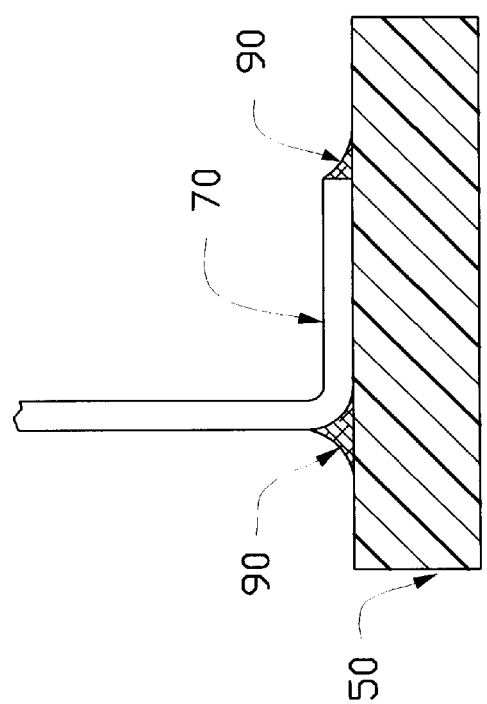
FIG. 1 is a partial cross-sectional view of a conventional electrical connector showing a grounding pad soldered on a circuit board in a limited contact area thereof with regard to a soldering paste.

As shown in FIGS. 5 & 6, the shell means (30) further includes a pair of grounding portions (35) respectively formed on the bottom edges of the opposing lateral surfaces (33) to be soldered on a surface (not labeled) of the circuit board (50) to serve the functions of both grounding and retention. Each grounding portion (35) consists of a protrusion (351), an engaging section (352) and a connecting section (353) wherein the connecting section (353) joins the grounding portion (35) with the shell means (30). The engaging section (352) is configured as a horizontal plate integrally extending from the connecting section (353) to provide a wide solder contact area for engaging with a soldering paste layer (90) pre-coated on the surface of the circuit board (50) for soldering onto the circuit board (50). The protrusion (351) vertically and upwardly extends from the engaging section (352) to provide an additional enlarged solder contact area for engaging with the soldering paste (90) whereby the retentive effect between the circuit board (50) and the shell means (30) is enhanced.

While the present invention has been described with reference to a specific embodiment, the description is illustrative of the invention and is not to be construed as limiting the invention in any way. Various modifications to the present invention can be made to the preferred embodiment by those skilled in the art without departing from the true spirit and scope of the invention as defined by the appended claims.

Therefore, person of ordinary skill in this field are to understand that all such equivalent structures are to be included within the scope of the following claims.

I claim:

1. An electrical connector for electrically connecting an exterior mating connector to a circuit board, comprising:

an insulative housing including a plurality of walls and receiving a plurality of contacts therein;

a shell means including a plurality of surfaces;

a grounding portion including a connecting section for joining the grounding portion with shell means, and engaging section providing an increased solder contact area to engage with a soldering paste pre-coating on a surface of the circuit board for soldering the grounding portion onto the circuit board, and a protrusion upward extending from said engaging section opposite the connection section along a vertical direction parallel to a lateral surface of said shell means and providing an additional enlarged solder area to engage with the soldering paste for enhancing the retention between the grounding portion and the circuit board.

2. The electrical connector as described in claim 1, wherein the engaging section of the grounding portion is configured to be a horizontal plate.

3. An electrical connector for electrically connecting an exterior mating connector to a circuit board, comprising:

an insulative housing having a mating slot for receiving the exterior mating connector therein;

a shell means having a plurality of surfaces wherein a continuous extension surrounds a border of an opening defined on one of the surfaces to be fully conformably received within the mating slot of the housing to provide a grounding connection with a shell of the exterior mating connector, wherein the extension is rearwardly extruded from a front surface of the shell means.

4. The electrical connector as described in claim 3, wherein said mating slot further receives an engaging plate receiving a plurality of contacts therein.

5. An electrical connector for electrically connecting an exterior mating connector and a circuit board, comprising:

an insulative housing having a mating slot for receiving the exterior mating connector therein and a cavity adjacent to the mating slot for receiving at least an electrical component therein;

a shell means having a plurality of surfaces wherein one of the surfaces covers said cavity of the housing for shielding protection, wherein the surface of the shell means covering the cavity, has an extension surrounding an inside of the mating slot.

6. The electrical connector as described in claim 5, wherein said cavity is separated from the mating slot.

7. The electrical connector as described in claim 3, wherein the insulative housing has a first retention and the shell means has a second retention for retaining the first retention.

8. The electrical connector as described in claim 3, wherein the shell means has a grounding portion adapted to be retained on the circuit board, the grounding portion comprising a protrusion extending upward.

9. The electrical connector as described in claim 5, wherein the insulative housing has a first retention and the shell means has a second retention for retaining the first retention.

10. The electrical connector as described in claim 5, wherein the shell means has a grounding portion adapted to be retained on the circuit board, the grounding portion comprising a protrusion extending upward.

* * * * *